(12) United States Patent
Ha et al.

(10) Patent No.: US 7,230,864 B2
(45) Date of Patent: Jun. 12, 2007

(54) CIRCUIT FOR GENERATING DATA STROBE SIGNAL OF SEMICONDUCTOR MEMORY DEVICE

(75) Inventors: Sung Joo Ha, Seoul (KR); Ho Youb Cho, Seoul (KR)

(73) Assignee: Hynix Semiconductors Inc, Icheon-si, Gyeonggi-do (KR)

( * ) Notice: Subject to any disclaimer, the term of this patent is extended or adjusted under 35 U.S.C. 154(b) by 0 days.

(21) Appl. No.: 11/606,928

(22) Filed: Dec. 1, 2006

(65) Prior Publication Data

US 2007/0076493 A1 Apr. 5, 2007

Related U.S. Application Data

(63) Continuation of application No. 11/115,351, filed on Apr. 27, 2005, now Pat. No. 7,161,856.

(30) Foreign Application Priority Data

Dec. 28, 2004 (KR) ...................... 10-2004-0114106

(51) Int. Cl.
*G11C 7/00* (2006.01)
(52) U.S. Cl. ...................... 365/194; 365/233
(58) Field of Classification Search ................ 365/194, 365/233, 293; 713/400, 401
See application file for complete search history.

(56) References Cited

U.S. PATENT DOCUMENTS

| | | | |
|---|---|---|---|
| 6,262,938 B1 | 7/2001 | Lee et al. | |
| 6,275,441 B1* | 8/2001 | Oh | 365/230.04 |
| 6,552,957 B2 | 4/2003 | Yagishita | |
| 6,636,446 B2 | 10/2003 | Lee et al. | |
| 6,760,261 B2 | 7/2004 | Partsch et al. | |
| 6,894,945 B2* | 5/2005 | Sawada | 365/233 |
| 2003/0086303 A1* | 5/2003 | Jeong | 365/189.05 |
| 2003/0179614 A1* | 9/2003 | Kono | 365/198 |
| 2003/0182595 A1 | 9/2003 | Carnevale et al. | |

FOREIGN PATENT DOCUMENTS

| | | |
|---|---|---|
| JP | 2004-145999 | 5/2004 |
| JP | 2004-192791 | 7/2004 |
| JP | 2004-327008 | 11/2004 |

* cited by examiner

*Primary Examiner*—Vu A. Le
(74) *Attorney, Agent, or Firm*—Johnny Kumar; Justin Darrow; Heller Ehrman, LLP (57) ABSTRACT

A circuit for generating a data strobe signal of a semiconductor memory device comprises a plurality of internal clock delay units, a selecting control unit and a pulse generating unit. The plurality of internal clock delay units delay an internal clock signal in response to a plurality of CAS latency signal. The selecting control unit logically combines a data latch control signal to latch input data with output signals from the plurality of internal clock delay units. The pulse generating unit generates the data strobe signal having a predetermined pulse in response to an output signal from the selecting control unit. In the circuit, a tDQSS margin is regulated depending on change of tCK of an operating frequency in response to a CAS latency signal.

16 Claims, 8 Drawing Sheets

CIRCUIT FOR GENERATING DATA STROBE SIGNAL OF SEMICONDUCTOR MEMORY DEVICE

CORRESPONDING RELATED APPLICATION

This application is a continuation of U.S. application Ser. No. 11/115,351 filed Apr. 27, 2005 now U.S. Pat. No. 7,161,856, which claims priority to Korean Patent Application No. 10-2004-0114106 filed Dec. 28, 2004, which are hereby incorporated by reference in their entirety.

BACKGROUND OF THE INVENTION

1. Field of the Invention

The present invention generally relates to a circuit for generating a data strobe signal of a semiconductor memory device, and more specifically, to a technology of regulating a tDQSS margin depending on change of an operating frequency tCK in response to a CAS latency signal.

2. Description of the Related Art

A synchronous DRAM (hereinafter, referred to as "SDRAM") which is operated synchronously with respect to an external system clock has been developed to improve an operating speed of a DRAM. Additionally, a Rambus DRAM and a double data rate (hereinafter, referred to as "DDR") SDRAM for processing data synchronously with respect to rising and falling edges of one clock have been also developed to further improve the operating speed of the data.

In case of the DDR SDRAM, a source synchronous interface is used because data are transmitted at a high speed. Here, input/output operations of the data are performed synchronously with respect to a data strobe signal (hereinafter, referred to as "DQS") at a data source.

Figure 1A:
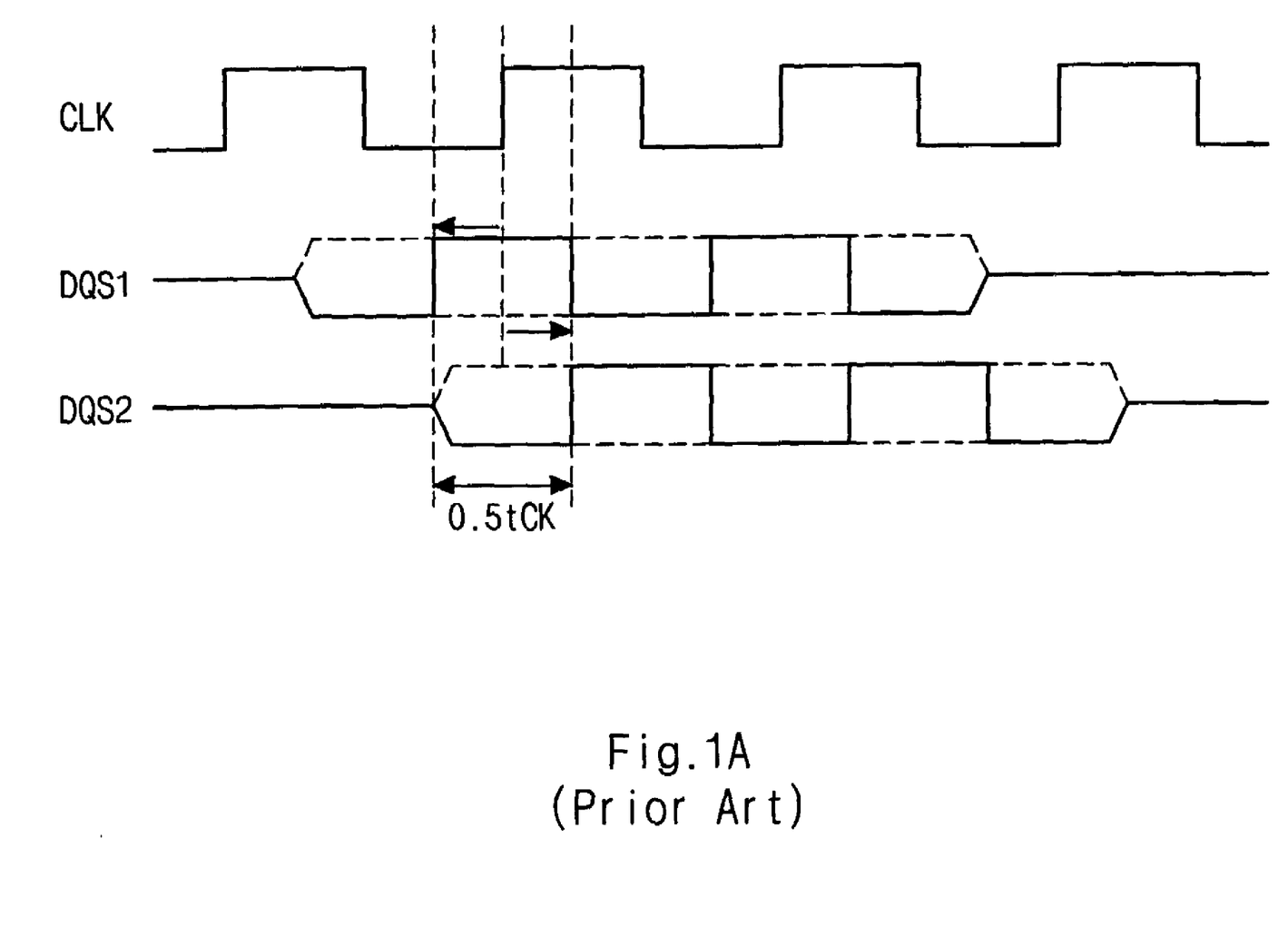
FIG. 1a is a timing diagram of a conventional clock and conventional data strobe signals.

FIG. 1a is a timing diagram of a conventional clock CLK and conventional data strobe signals DQS1 and DQS2.

At a JEDEC standard, tDQSS of DDR1 (time from a rising edge of the clock to a first rising edge of the data strobe signal) is defined as 0.75*tCK~1.25*tCK, and tDQSS of DDR2 is defined as WL (Write Latency: time from input of a write command to input of data) −0.25*tCK~WL+0.25*tCK.

Hereinafter, the data strobe signal and a tDQSS margin will be explained using an example of DDR1. As mentioned above, in case of the DDR1, a falling edge of the data strobe signal DQS ranges from 0.75*tCK to 1.25*tCK, that is, the data strobe signal has a margin of 0.5*tCK.

Figure 1B:
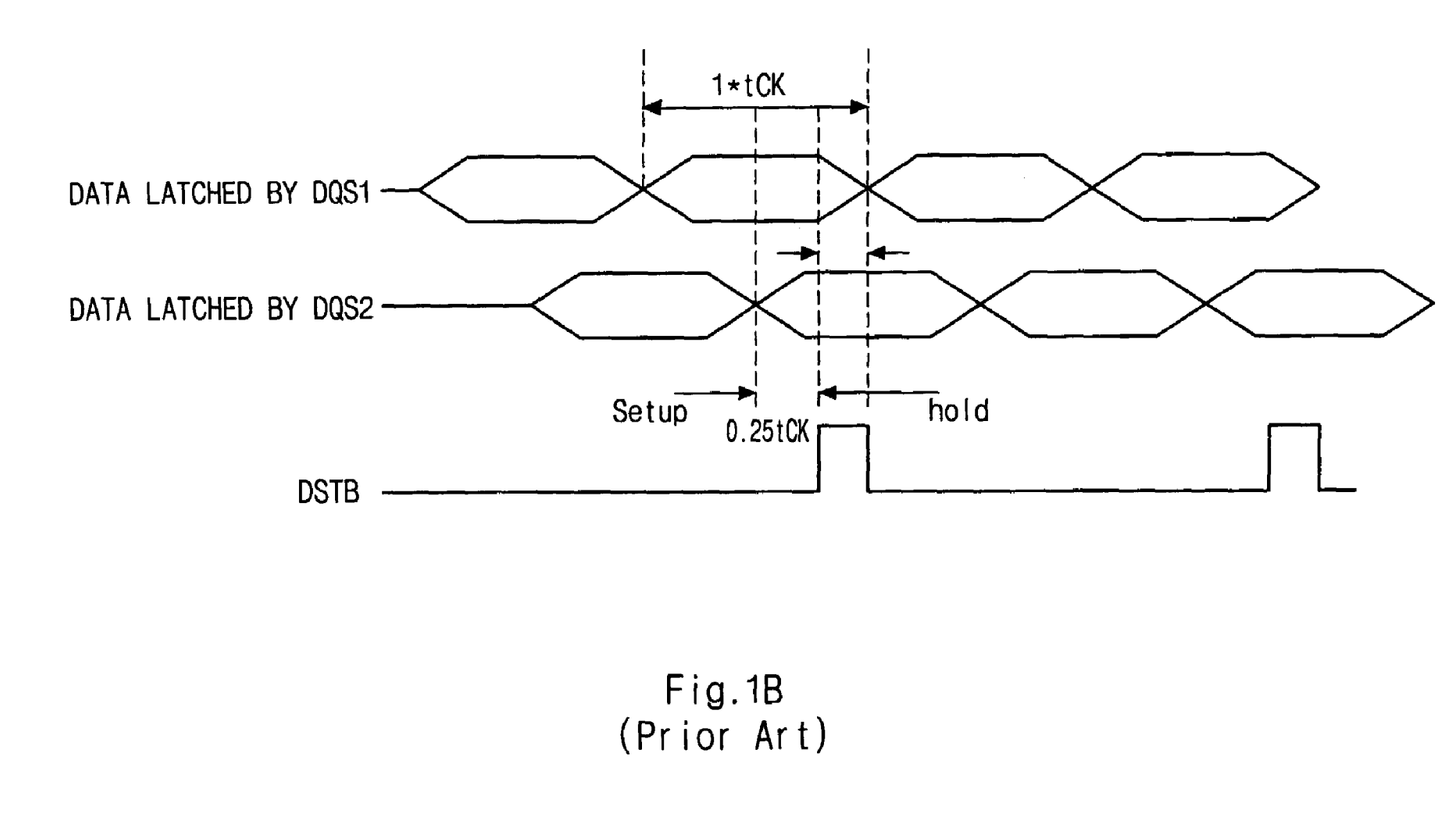

FIG. 1b is a diagram illustrating data latched by the data strobe signals of FIG. 1a.

A skew between the data strobe signals is represented by tDQSS. The fastest data strobe signal DQS1 can be enabled after 0.75tCK from the write command, and the latest data strobe signal DQS2 is enabled after 1.25tCK from the write command. In other words, one data strobe signal is not constantly inputted at the same timing whenever a write operation is performed but fast or late inputted depending on change of peripheral environment.

In this case, data arranged by each data strobe signal have skews of 0.5tCK, respectively.

As a result, the latest data of data inputted by a first write command should latched not by a control signal of a clock domain but by the data strobe signal before the fastest data of data inputted by a second write command is enabled.

The data arranged by the data strobe signals have a timing margin of 0.5tCK in a domain cross portion (where data are transited from a data strobe domain to a clock domain), and a value of tDQSS has a setup/hold margin of 0.25tCK.

However, it is difficult to secure a sufficient tDQSS margin at tCK of all operating frequencies because a value of tCK is differentiated depending on an operating frequency of the memory.

Figure 2:
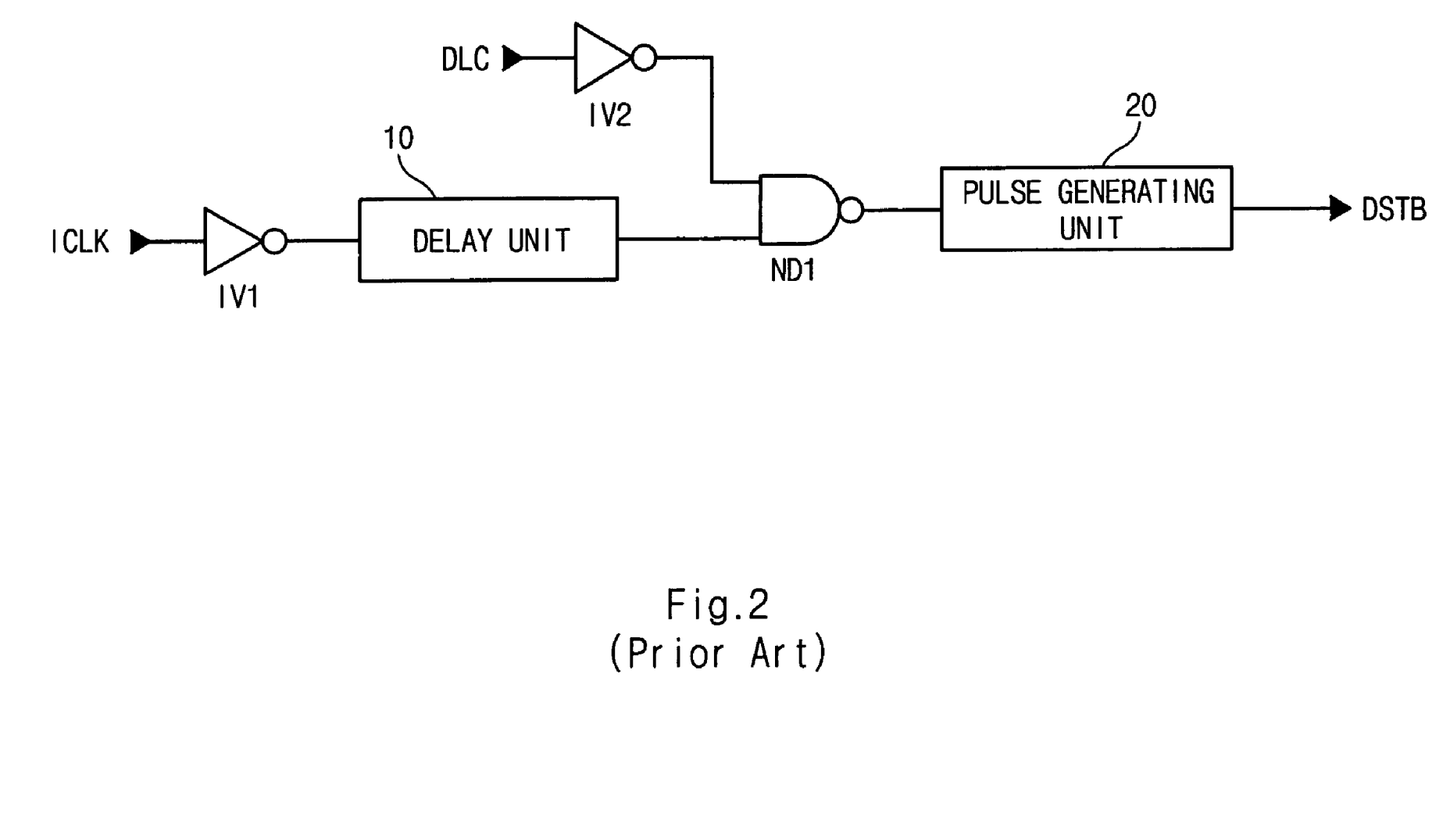
FIG. 2 is a diagram illustrating a conventional circuit for generating a data strobe signal.

FIG. 2 is a diagram illustrating a conventional circuit for generating a data strobe signal.

The conventional circuit for generating a data strobe signal comprises inverters IV1 and IV2, a delay unit 10, a NAND gate ND1 and a pulse generating unit 20.

The inverter IV1 inverts an internal clock signal ICLK, and the inverter IV2 inverts a data latch control signal DLC. Here, the internal clock signal ICLK to delay an external clock signal CLK is a clock signal which is a basis of the internal operation, and the data latch control signal DLC is a control signal to latch data inputted externally at the write operation.

The delay unit 10 delays an output signal from the inverter IV1. Here, the value of tDQSS is regulated depending on a delay time of the delay unit 10, and the delay unit 10 previously set the delay time.

The NAND gate ND1 performs a NAND operation on output signals from the inverter IV2 and the delay unit 10.

The pulse generating unit 20 outputs a data strobe signal DSTB having a pulse in response to an output signal from the NAND gate ND1. That is, the pulse generating unit 20 generates a pulse signal having a width corresponding to an internally designated delay when the internal clock signal ICLK transits to 'high'.

Figure 3:
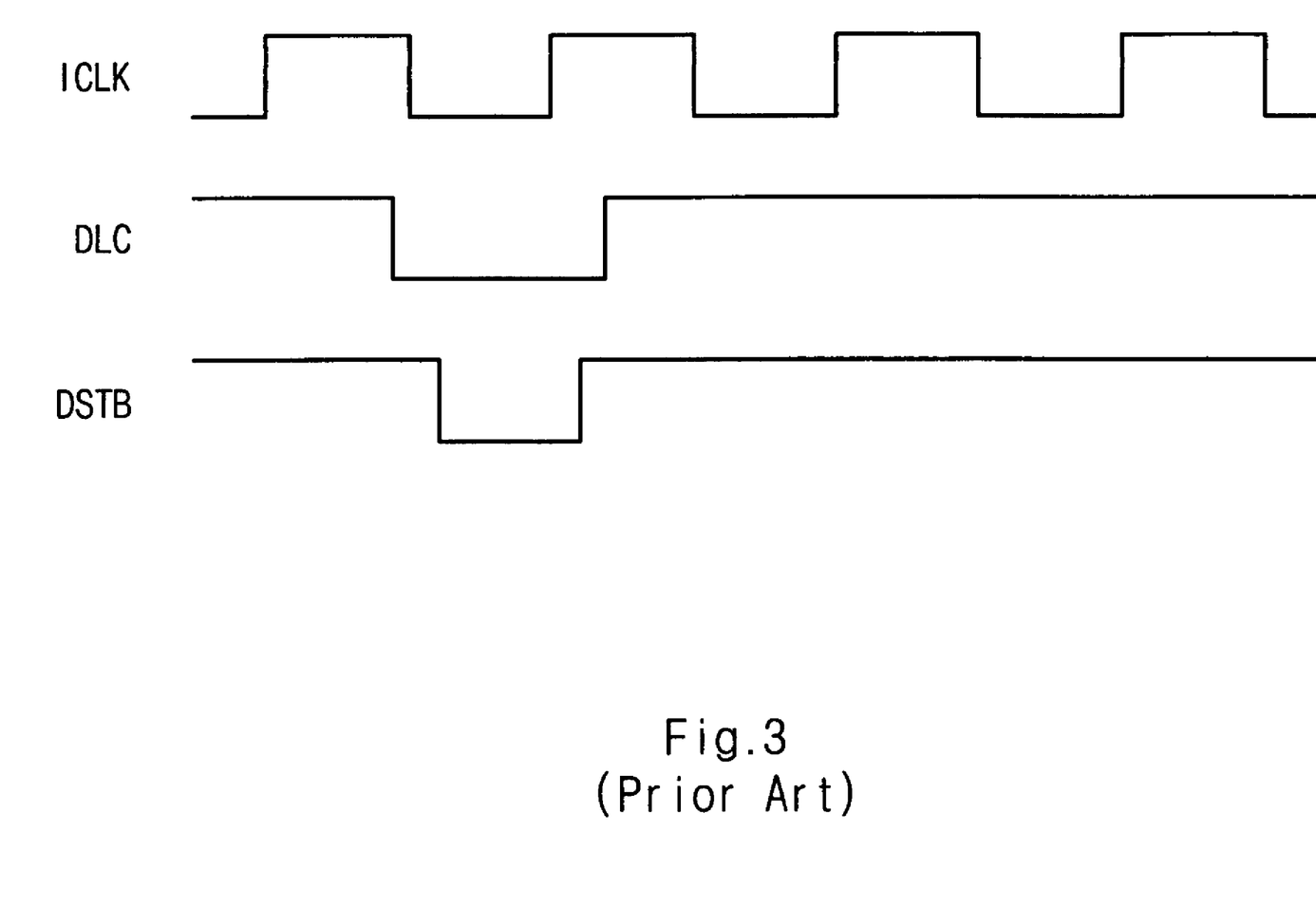
FIG. 3 is a timing diagram illustrating the circuit for generating a data strobe signal of FIG. 2.

In the above-described conventional circuit for generating the data strobe signal, as shown in FIG. 3, the data strobe signal DSTB is enabled to 'low' when the internal clock signal ICLK is applied and the data latch control signal DLC is enabled to 'low'. That is, while the data latch control signal DLC is at the low level, the data strobe signal DSTB is generated.

As a result, since the value of tDQSS is regulated depending on the delay time determined in the delay unit 10 regardless of change of the tCK resulting from the change of the operating frequency, it is difficult to secure the sufficient tDQSS margin when the operating frequency is change to cause change of the tCK.

SUMMARY OF THE INVENTION

Accordingly, it is an object of the present invention to secure a sufficient tDQSS margin on all tCKs by regulating characteristics of the tDQSS on each tCK depending on change of a value of the tCK in response to a CAS latency signal.

In an embodiment, a circuit for generating a data strobe signal of a semiconductor memory device comprises a plurality of internal clock delay units, a selecting control unit and a pulse generating unit. The plurality of internal clock delay units delay an internal clock signal in response to a plurality of CAS latency signal. The selecting control unit logically combines a data latch control signal to latch input data with output signals from the plurality of internal clock delay units. The pulse generating unit generates the data strobe signal having a predetermined pulse in response to an output signal from the selecting control unit.

BRIEF DESCRIPTION OF THE DRAWINGS

Other aspects and advantages of the present invention will become apparent upon reading the following detailed description and upon reference to the drawings in which:

FIG. 1b is a diagram illustrating data latched by the data strobe signals of FIG. 1a:

DETAILED DESCRIPTION OF THE PREFERRED EMBODIMENTS

The present invention will be described in detail with reference to the accompanying drawings.

Figure 4:
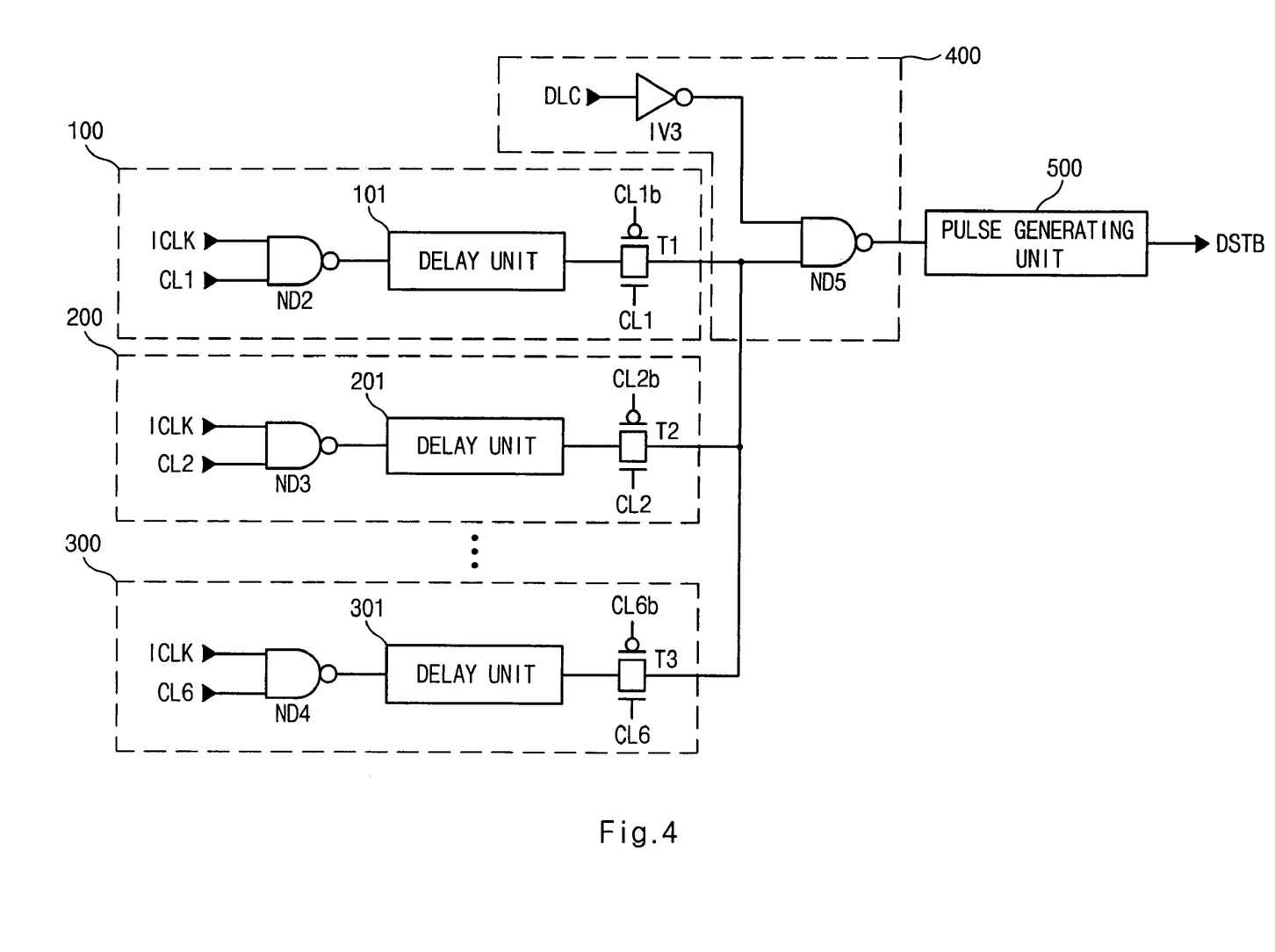
FIG. 4 is a diagram illustrating a circuit for generating a data strobe signal according to an embodiment of the present invention.

FIG. 4 is a diagram illustrating a circuit for generating a data strobe signal according to an embodiment of the present invention.

In an embodiment, a circuit for generating an data strobe signal comprises an internal clock delay units 100~300, a selecting control unit 400 and a pulse generating unit 500.

The internal clock delay unit 100 comprises a NAND gate ND2, a delay unit 101 and a transmission gate T1. The NAND gate ND2 performs a NAND operation on an internal clock signal ICLK and a CAS latency signal CL1. The delay unit 101 delays an output signal from the NAND gate ND2. The transmission gate T1 selectively transmits an output signal from the delay unit 101 in response to CAS latency signals CL1 and CL1b.

The internal clock delay unit 200 comprises a NAND gate ND3, a delay unit 201 and a transmission gate T2. The NAND gate ND3 performs a NAND operation on the internal clock signal ICLK and a CAS latency signal CL2. The delay unit 201 delays an output signal from the NAND gate ND3. The transmission gate. T2 selectively transmits an output signal from the delay unit 201 in response to CAS latency signals CL2 and CL2b.

The internal clock delay unit 300 comprises a NAND gate ND4, a delay unit 301 and a transmission gate T3. The NAND gate ND4 performs a NAND operation on the internal clock signal ICLK and a CAS latency signal CL6. The delay unit 301 delays an output signal from the NAND gate ND4. The transmission gate T3 selectively transmits an output signal from the delay unit 301 in response to CAS latency signals CL6 and CL6b.

Here, each delay unit 101~301 of the internal clock delay units 100~300 has a different delay time to be set in response to the CAS latency signals CL1~CL6.

The selecting control unit 400 comprises an inverter IV3 and a NAND gate ND5.

The inverter IV3 inverts the data latch control signal DLC, and the NAND gate ND5 performs a NAND operation on an output signal from the inverter IV3 and selectively received output signals from the transmission gates T1~T3.

Here, the internal clock signal ICLK obtained by delaying the external clock signal CLK is a clock signal which is a basis of the internal operation, and the data latch control signal DLC is a control signal for latching data inputted externally at a write mode.

Here, the CAS latency signals CL1~CL6 represent a time required from input of a read command to output of data. That is, if a predetermined required time from the input of the read command to the output of data is converted into a clock number, its value is differentiated depending on an operating frequency.

For example, suppose that a time of 10 ns is required in the input of the read command to the output of data. For the time of 10 ns, 5 clocks (CL5) is required when one clock cycle tCK is 2 ns, and 4 clocks (CL4) is required when the tCK is 3 ns.

The CAS latency signals CL1~CL6 are set by a mode register setting (hereinafter, referred to as "MRS") (not shown). For example, if the MRS (not shown) is set to use CL2, a CL2 signal continuously has a high level and only the delay unit 200 is driven until the MRS (not shown) is reset to be changed, so that an output signal from the delay unit 200 is transmitted through the transmission gate T2 to an input terminal of the NAND gate ND5.

The pulse generation unit 500 generates a pulse having a width corresponding to an internally designated delay in response to an output signal from a NAND gate ND5.

Figure 5:
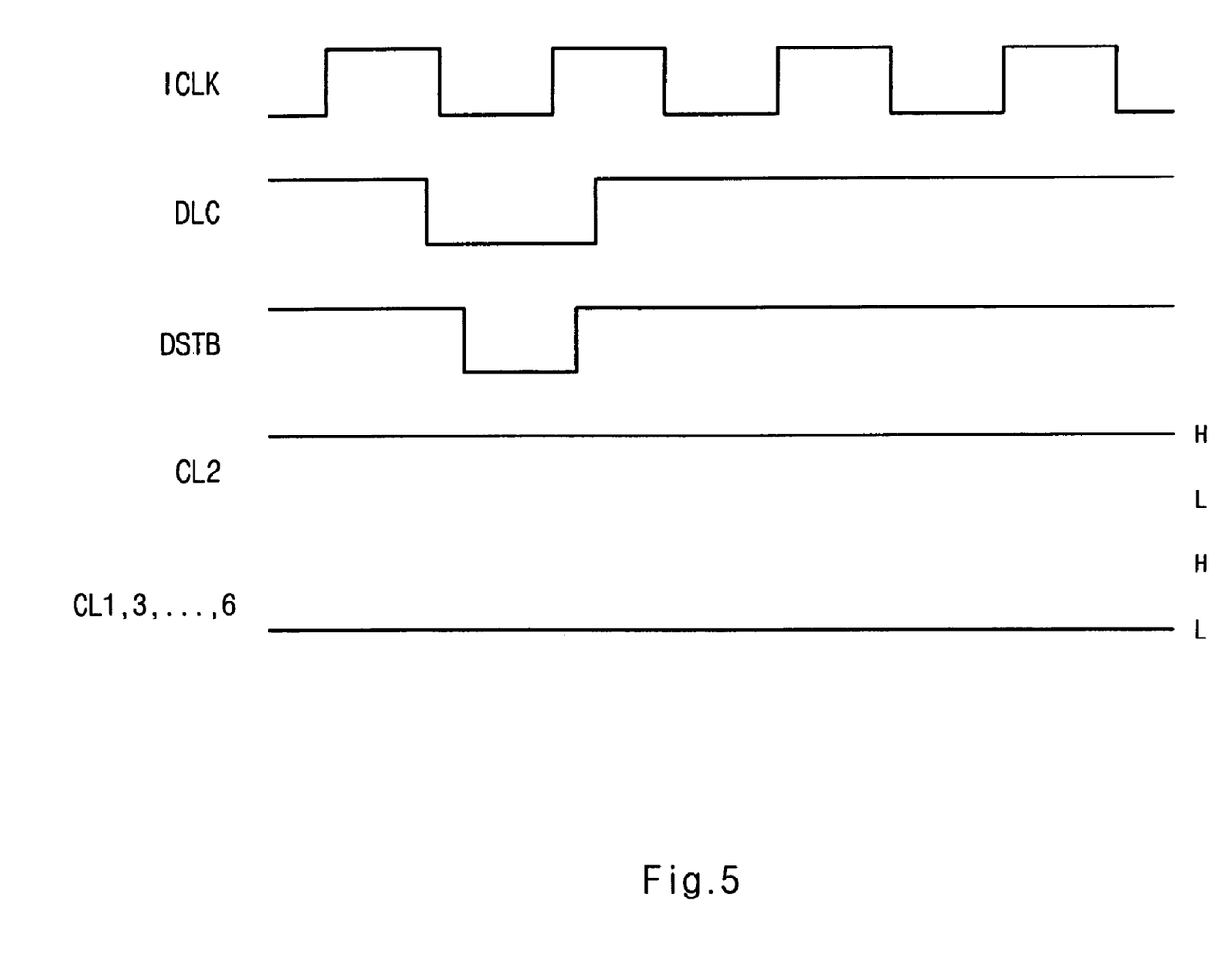
FIG. 5 is a timing diagram illustrating the circuit for generating a data strobe signal of FIG. 4.

FIG. 5 is a timing diagram illustrating the circuit for generating the data strobe signal of FIG. 4. Here, when the MRS (not shown) sets the CAS latency CL2 is shown.

The CAS latency signal CL2 is enabled to 'high', and the rest CAS latency signals CL1, CL3~CL6 are disabled to 'low'.

As a result, only the transmission gate T2 of the internal clock delay unit 200 is driven in response to the CAS latency signal CL2, thereby outputting the output signal from the delay unit 201 as an input signal of the NAND gate ND5.

That is, a value of the tDQSS is regulated by the delay unit 201 in response to the CAS latency signal CL2, so that the circuit for generating a data strobe signal outputs the data strobe signal DSTB.

Figure 6:
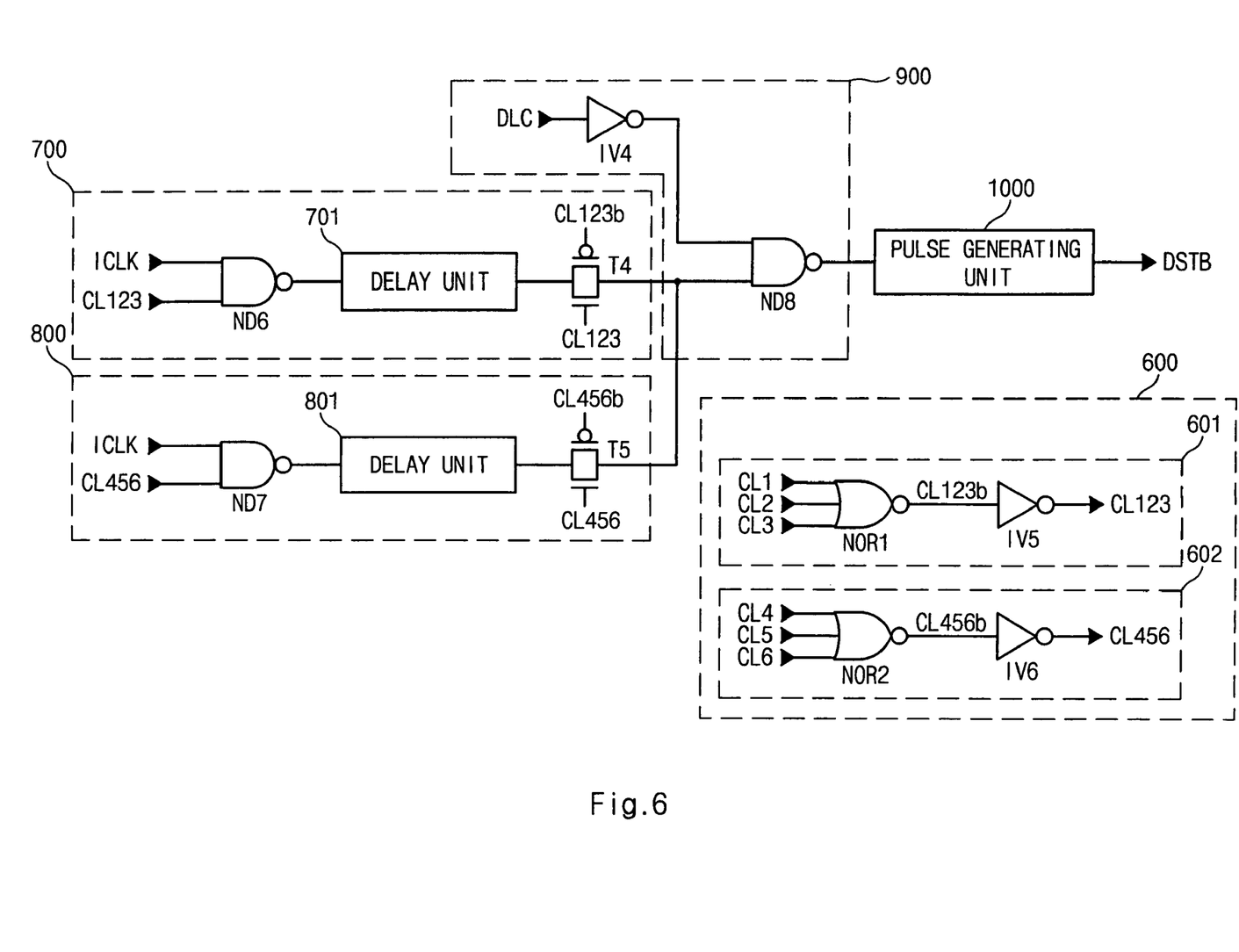
FIG. 6 is a diagram illustrating a circuit for generating a data strobe signal according to another embodiment of the present invention.

FIG. 6 is a diagram illustrating the circuit for generating the data strobe signal according to another embodiment of the present invention.

In another embodiment, the circuit for generating the data strobe signal comprises a CAS latency combination unit 600, an internal clock delay units 700 and 800, and a selecting control unit 900 and a pulse generating unit 1000.

The CAS latency combination unit 600 comprises first and second CAS latency combination units 601 and 602. The first CAS latency combination unit 601 comprises a NOR gate NOR1 and an inverter IV5. The NOR gate NOR1 performs a NOR operation on the CAS latency signals CL1~CL3 to output a combination bar signal CL123b. The inverter IV5 inverts the combination bar signal CL123b to output a combination signal CL123.

The second CAS latency combination unit 602 comprises a NOR gate NOR2 and an inverter IV6. The NOR gate NOR2 performs a NOR operation on the CAS latency signals CL4~CL6 to output a combination bar signal CL456b. The inverter IV6 inverts the combination bar signal CL456b to output a combination signal CL456.

The internal clock delay unit 700 comprises a NAND gate ND6, a delay unit 701 and a transmission gate T4. The NAND gate ND6 performs a NAND operation on the internal clock signal ICLK and the Combination signal CL123. The delay unit 701 delays an output signal from the NAND gate ND6. The transmission gate T4 transmits an output signal from the delay unit 701 in response to a pair of the combination signals CL123 and CL123b.

The internal clock delay unit 800 comprises a NAND gate ND7, a delay unit 801 and a transmission gate T5. The NAND gate ND7 performs a NAND operation on the internal clock signal ICLK and the CAS latency signal CL456. The delay unit 801 delays an output signal from the NAND gate ND7. The transmission gate T5 transmits an output signal from the delay unit 801 in response to a pair of the combination signals CL456 and CL456b.

The selecting control unit 900 comprises an inverter IV4 and a NAND gate ND8.

The inverter IV4 inverts the data latch control signal DLC, and the NAND gate ND8 performs a NAND operation on an output signal from the inverter IV4 and selectively transmitted output signals from the transmission gates T4 and T5.

The pulse generating unit 1000 generates a pulse signal DSTB having a width corresponding to an internally designated delay in response to an output signal from the NAND gate ND8.

Figure 7:
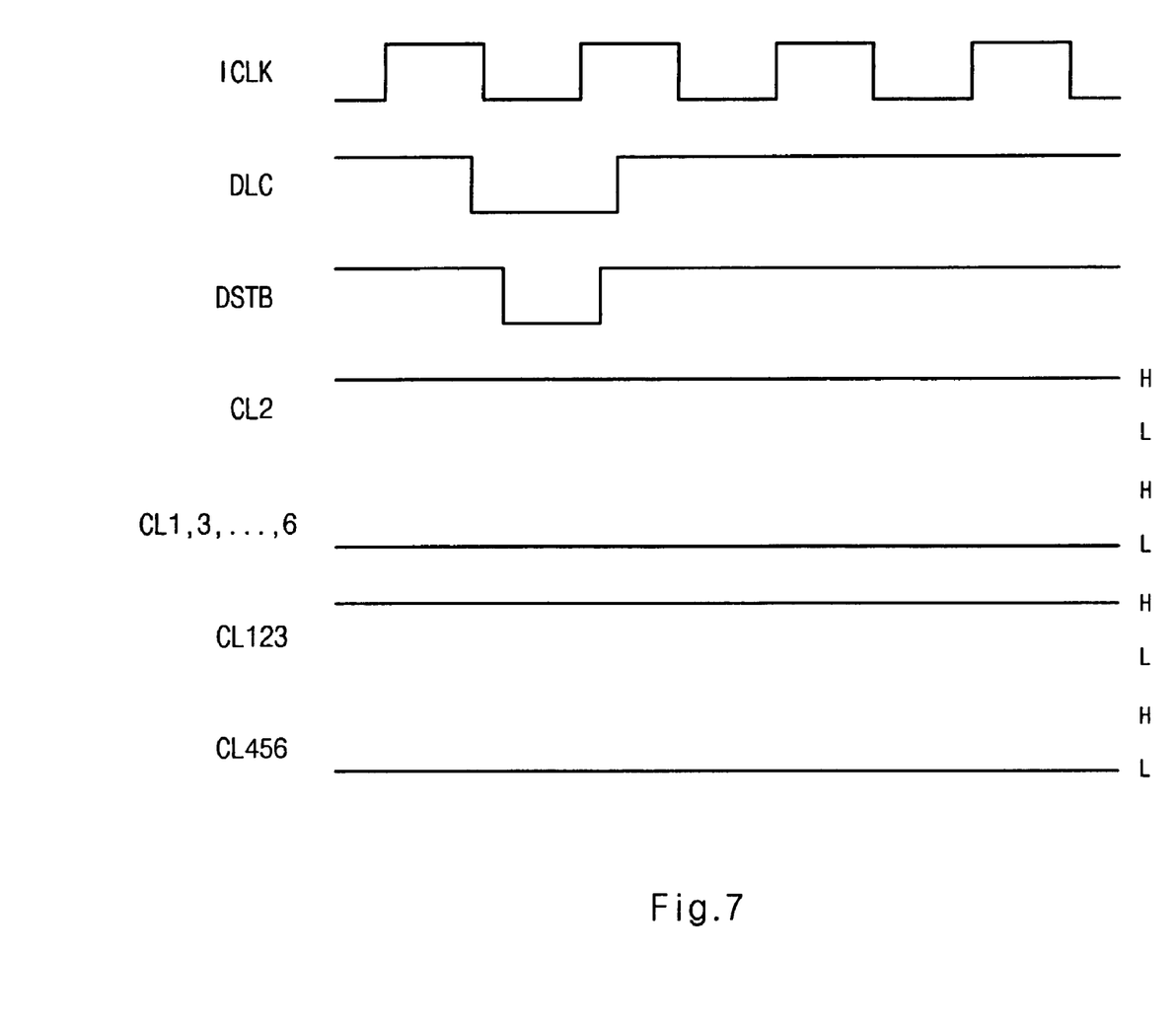
FIG. 7 is a timing diagram illustrating a circuit for generating a data strobe signal of FIG. 6.

FIG. 7 is a timing diagram illustrating the circuit for generating the data strobe signal of FIG. 6. Here, when the MRS (not shown) sets the CAS latency CL2 is shown.

The CAS latency signal CL2 is enabled to 'high', and the rest CAS latency signals CL1, CL3~CL6 are disabled to 'low', so that the combination signal CL123 is enabled to 'high' and the combination signal CL456 is disabled to 'low'.

As a result, only the transmission gate T4 of the internal clock delay unit 700 is driven in response to the combination signal CL123, thereby outputting the output signal from the delay unit 701 as an input signal of the NAND gate ND6.

That is, a value of the tDQSS is regulated by the delay unit 701 in response to the combination signal CL123, so that the circuit for generating the data strobe signal outputs the data strobe signal DSTB.

In this way, the circuit according to the embodiment of the present invention regulates the value of tDQSS by regulating the delay time in response to the CAS latency signals CL1~CL6.

As described above, in a circuit for generating a data strobe signal according to an embodiment of the present invention, a sufficient tDQSS margin can be secured on all tCKs by regulating characteristics of the tDQSS on each tCK depending on change of a value of the tCK, thereby preventing fail.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A circuit for generating a data strobe signal of a semiconductor memory device, comprising:
  a first internal clock delay unit for delaying an internal clock signal according to a first operating frequency;
  a second internal clock delay unit for delaying an internal clock signal according to a second operating frequency;
  a selecting control unit for selecting one of an output signals from the first internal clock delay unit and the second internal clock delay unit; and
  a data strobe signal generating unit for generating a data strobe signal in response to a data latch control signal and an output signal from the selecting control unit.

2. The circuit according to claim 1, wherein the first internal clock delay unite is configured to adjust a tDQSS characteristic to the first operating frequency; and
  wherein the second internal clock delay unit is configured to adjust a tDQSS characteristic according to the second operating frequency.

3. The circuit according to claim 1, wherein the first internal clock delay unite comprises:
  a first logic operation unit for performing a logic operation on the internal clock signal and a first control signal, wherein the first control signal has an information of the first operation frequency; and
  a first delay unit for delaying an output signal from the first logic operation unit; and
  wherein the second internal clock delay unit comprises:
    a second logic operation unit for performing a logic operation on the internal clock signal and a second control signal, wherein the second control signal has an information of the second operation frequency; and
    a second delay unit for delaying an output signal from the second logic operation unit.

4. The circuit according to claim 3, wherein the logic operation unit includes a NAND gate.

5. The circuit according to claim 1, wherein the selecting control unit comprises a first transmission gate and a second transmission gate,
  wherein the first transmission gate for selectively outputting an output signal from the first internal clock delay unit; and
  wherein the second transmission gate for selectively outputting an output signal from the second internal clock delay unit.

6. A circuit for generating a data strobe signal of a semiconductor memory device, comprising:
  a plurality of internal clock delay units for delaying an internal clock signal in response to a plurality of combination signals, respectively;
  a selecting control unit for selecting one of output signals from the plurality of internal clock delay units;
  a data strobe signal generating unit for generating a data strobe signal in response to a data latch control signal and an output signal from the selecting control unit; and
  a plurality of combination units for combining a plurality of control signals to output the plurality of signals, respectively;
  wherein the plurality of control signals each has an information of corresponding to an operation frequency.

7. The circuit according to claim 6, wherein each of the plurality of internal clock delay units is configured to adjust a tDQSS characteristic corresponding to each tCK at a different delay timing in response to the plurality of combination signals, respectively.

8. The circuit according to claim 6, wherein each of the plurality of combination units comprises a logic operation unit for performing a logic operation on the plurality of corresponding to control signals.

9. The circuit according to claim 8, wherein the logic operation unit includes a NOR gate.

10. The circuit according to claim 6, wherein each of the plurality of internal clock delay units comprises:
   a logic operation unit for performing a logic operation on the internal clock signal and one of the plurality of combination signals;
   a delay unit for delaying an output signal from the logic operation unit.

11. The circuit according to claim 10, wherein the logic operation unit includes a NAND gate.

12. The circuit according to claim 6, wherein the selecting control unit comprises a plurality of transmission gate for selectively outputting output signals from the plurality of internal clock delay units.

13. The circuit according to claim 1, wherein the selecting control unit selects one of an output signals from the first internal clock delay unit and the second internal clock delay unit according to the first operation frequency and the second operation frequency.

14. The circuit according to claim 1, wherein the data strobe signal generating unit comprises;
   a logic operation unit for performing a logic operation on the data latch control signal and the output signal from the selecting control unit; and
   a pulse generating unit for generating the data strobe signal having a predetermined pulse width in response to an output signal from the logic operation unit.

15. The circuit according to claim 8, wherein the selecting control unit selects one of an output signals from the plurality of internal clock delay units in response to the plurality of combination signals.

16. The circuit according to claim 6, wherein the data strobe signal generating unit comprises;
   a logic operation unit for performing a logic operation on the data latch control signal and the output signal from the selecting control unit; and
   a pulse generating unit for generating the data strobe signal having a predetermined pulse width in response to an output signal from the logic operation unit.

* * * * *